United States Patent
Mii

(10) Patent No.: US 7,044,357 B2
(45) Date of Patent: May 16, 2006

(54) BUMP FORMATION METHOD AND WIRE BONDING METHOD

(75) Inventor: Tatsunari Mii, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 64 days.

(21) Appl. No.: 10/781,189

(22) Filed: Feb. 17, 2004

(65) Prior Publication Data

US 2004/0164128 A1    Aug. 26, 2004

(30) Foreign Application Priority Data

Feb. 17, 2003    (JP) .............................. 2003-038312

(51) Int. Cl.
*B23K 31/02*    (2006.01)
(52) U.S. Cl. ................. 228/180.5; 228/4.5; 228/180.22
(58) Field of Classification Search ............. 228/180.5, 228/4.5, 175, 180.22; 438/612, 613; 257/673, 257/676, 737, 773
See application file for complete search history.

(56) References Cited

U.S. PATENT DOCUMENTS 4,442,967 A * 4/1984 van de Pas et al. ........ 228/159
6,715,666 B1 * 4/2004 Imai et al. ................ 228/180.5
6,863,208 B1 * 3/2005 Lee .......................... 228/180.5
2004/0152292 A1 * 8/2004 Babinetz et al. ............ 438/617

FOREIGN PATENT DOCUMENTS

JP        6-95468      11/1994
JP        2735022       1/1998

* cited by examiner

*Primary Examiner*—Kevin Kerns
*Assistant Examiner*—Michael Aboagye
(74) *Attorney, Agent, or Firm*—Koda & Androlia

(57) ABSTRACT

Bump formation method and wire bonding method including a step of forming a ball on the tip end of a wire that passes through a capillary and joining this ball to an electrode pad so as to make a press-bonded ball. In the next step, the capillary is raised and moved horizontally so that the bottom flat portion of the capillary faces the press-bonded ball. Then, the capillary is lowered and the press-bonded ball is pressed, thus forming a first bump. Next, the capillary is raised and moved horizontally in a direction that is opposite from the previous horizontal-direction, thus positioning the flat portion of the capillary to face the first bump. Then, the capillary is lowered, and the wire is bent and pressed against the surface of the first bump so as to form a second bump. The wire is then cut from the second bump.

4 Claims, 6 Drawing Sheets

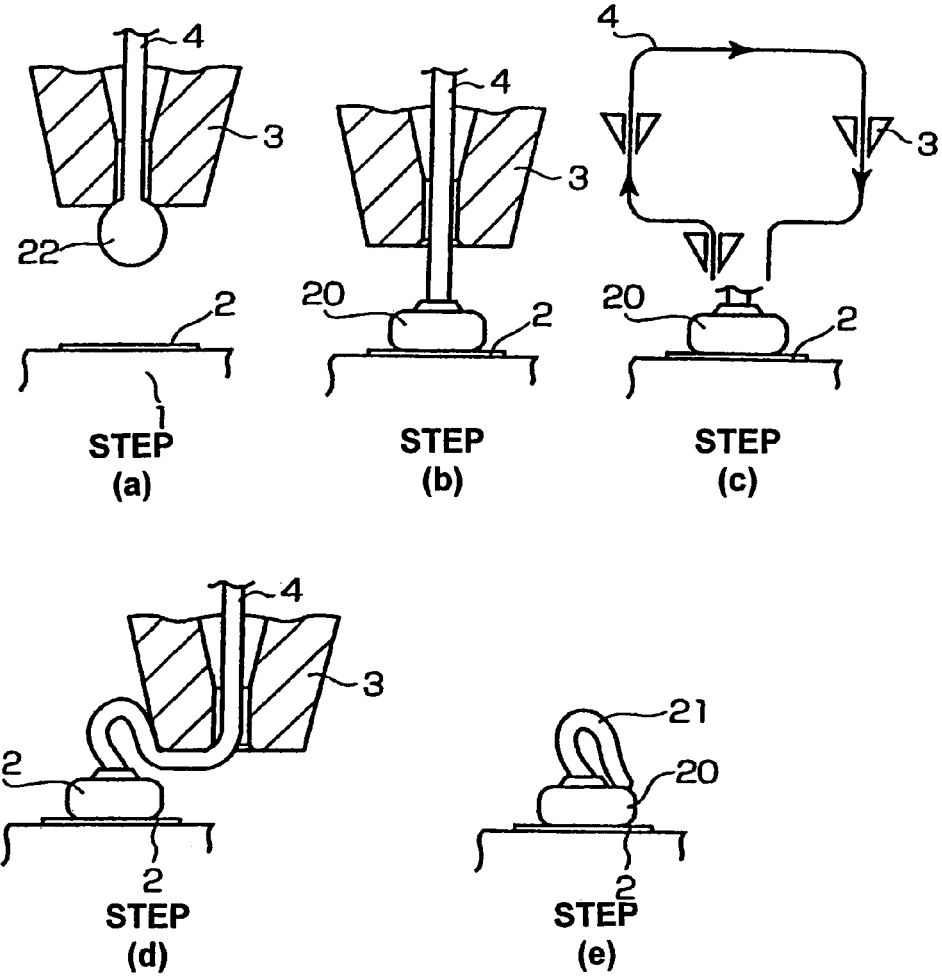

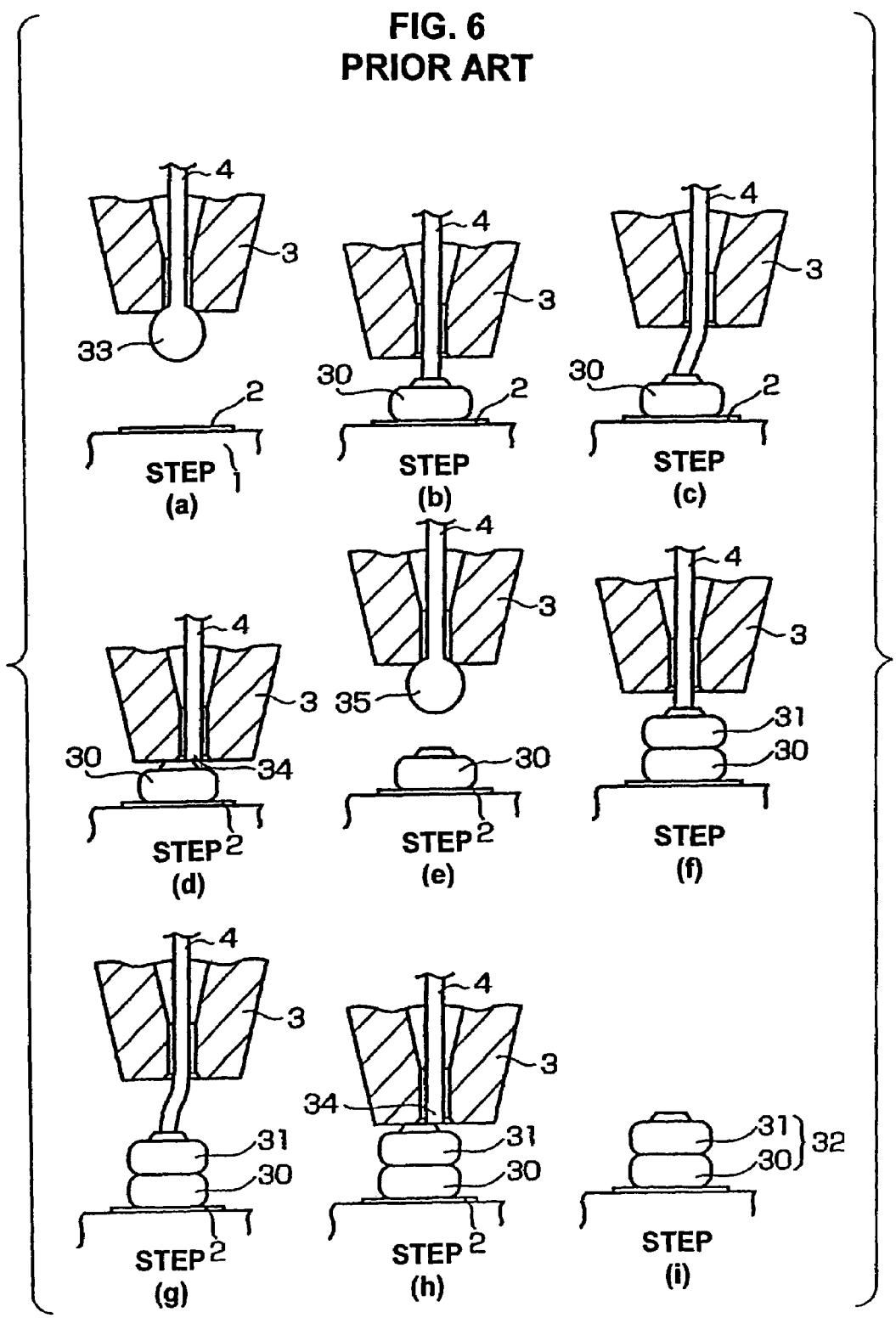

BUMP FORMATION METHOD AND WIRE BONDING METHOD

BACKGROUND OF THE INVENTION

1. Field of the Invention

The present invention relates to a bump formation method for use in the mounting of semiconductor elements, in the connection of wires, etc. and to a wire bonding method for performing wire bonding between two conductors.

2. Prior Art

The method shown in FIG. 5 (see Japanese Patent Application Publication (Kokoku) No. 6-95468 (corresponding to Japanese Patent Application Laid-Open (Kokai) No. 63-304587)) and the method shown in FIG. 6 (see Japanese Patent No. 2735022 (corresponding to Japanese Patent Application Laid-Open (Kokai) No. 8-264540)) are the conventional bump formation methods that allow the formation of bumps with a large height in an extremely simple manner.

In the bump formation method shown in FIG. 5, as seen from the illustration of step (e) in FIG. 5, the bottom portion 20 of a projection-form contact point is formed on top of an electrode pad 2 on the surface of a semiconductor element 1, and the top portion 21 of a ring-form or inverted U shaped projection-form contact point formed as a continuation of this bottom portion 20 on top of the bottom portion 20.

The formation process is as follows: first, in step (a) in FIG. 5, a ball 22 is formed by means of a discharge spark, etc. on the tip end of a wire 4 that passes through a capillary 1. Next, in step (b), the capillary 3 is lowered, and the ball 22 is joined to the surface of the electrode pad 2 by hot press-bonding or ultrasonic vibration, etc., so that the bottom portion 20 of the projection-form contact point is formed. Next, in step (c), the capillary 3 is moved in a loop form, and then, in step (d), the capillary 3 is lowered, the wire 4 is connected to the upper surface of the bottom portion 20, and the wire 4 is cut, so that the top portion 21 which has a ring-form shape or inverted U shape is formed.

In the bump formation method shown in FIG. 6, as seen from the illustration of step (i), a first bump 30 is formed on top of an electrode pad 2 on the surface of a semiconductor element 1, and a second bump 31 is formed on top of this first bump 30, so that a two-stage bump 32 is formed.

The formation process in this case is as follows: first, in step (a), a ball 33 is formed by means of a discharge spark, etc. on the tip end of a wire 4 that passes through a capillary 3. Next, in step (b), the capillary 3 is lowered, and the ball 33 is joined to the surface of the electrode pad 2 by hot press-bonding or ultrasonic vibration, so that a first bump 30 is formed. Next, in step (c), the capillary 3 is raised, and the capillary 3 is moved in the horizontal direction so that a flat portion on the tip end of the capillary 3 is positioned so as to face the center of the first bump 30.

Next, in step (d), the capillary 3 is lowered and the first bump 30 is formed; then, a cut-out 34 is formed in the wire 4 by the application of ultrasonic waves, after which the capillary 3 is raised and the wire 4 is cut, thus forming the first bump 30. Then, in step (e), a ball 35 is formed on the tip end of the wire 4. Subsequently, a second bump 31 is formed on top of the first bump 30 by the steps (f) through 6 (h), in the same manner as in the steps (b) through 6 (d) shown in FIG. 6.

In the method of Japanese Patent Application Publication (Kokoku) No. 6-95468 shown in FIG. 5, the shape of the top portion 21 is in a ring-form shape or inverted U shape. However, since there is a clearance between the internal diameter of the hole in the tip end of the capillary 3 and the external diameter of the wire, slack is generated in the wire 4 during the driving of the capillary 3, so that the top portion 21 cannot be obtained with a uniform ring-form shape of inverted U shape. Moreover, there is a variation in the orientation of this shape.

In the method of Japanese Patent No. 2,735,022 shown in FIG. 6, in cases where a two-stage bump 32 (including bumps 30 and 31) is formed, two steps that form the balls 22 and 33 and two steps that cut the wire 4 are required. In other words, since a number of ball formation steps and wire cutting steps corresponding to the number of stages in the bump are required, this method has a problem of poor productivity.

SUMMARY OF THE INVENTION

The object of the present invention is to provide a bump formation method and wire bonding method that allows the formation of bumps with a uniform height and shape and that is superior in terms of productivity.

The above object is accomplished by a set of unique sequential steps of the present invention for a bump formation method that includes: a first step that forms a ball on the tip end of a wire that passes through a capillary and joins the ball to a conductor to form a press-bonded ball; a second step that raises and moves the capillary in the horizontal direction so that a flat portion on the lower end of the capillary is positioned to face the press-bonded ball; a third step that lowers the capillary so that the press-bonded ball is pressed to form a first bump; a fourth step that raises and lowers the capillary in the opposite horizontal direction from the horizontal-direction movement of the capillary in the second step so that the flat portion on the lower end of the capillary is positioned to face the first bump; a fifth step that lowers the capillary so that the wire is bent and pressed against the surface of the first bump, thus forming a second bump; and a sixth step that cuts and separates the wire from the second bump.

The above object is accomplished by another set of unique sequential steps of the present invention for a bump formation method that includes: a first step that forms a ball on the tip end of a wire that passes through a capillary and joins the ball to a conductor to form a press-bonded ball; a second step that raises and moves the capillary in the horizontal direction so that a flat portion on the lower end of the capillary is positioned to face the press-bonded ball; a third step that lowers the capillary so that the press-bonded ball is pressed to form a first bump; a fourth step that raises and lowers the capillary in the opposite horizontal direction from the horizontal-direction movement of the capillary in the second step so that the flat portion on the lower end of the capillary is positioned to face the first bump; a fifth step that lowers the capillary so that the wire is bent and pressed against the surface of the first bump, thus forming a second bump; and a sixth step that raises and moves the capillary in the opposite horizontal direction from the horizontal-direction movement in the fourth step so as to cause the flat portion on the lower end of the capillary to be positioned to face the second bump; a seventh step that lowers the capillary so that the wire is bent and pressed against the surface of the second bump to form a third bump; and an eighth step that cuts and separates the wire from the uppermost bump.

The above object is accomplished by still another set of unique sequential steps of the present invention for a bump formation method that includes: a first step that forms a ball on the tip end of a wire that passes through a capillary and joins the ball to a conductor to form a press-bonded ball; a second step that raises and moves the capillary in the horizontal direction so that a flat portion on the lower end of the capillary is positioned to face the press-bonded ball; a third step that lowers the capillary so that the press-bonded ball is pressed to form a first bump; a fourth step that raises and lowers the capillary in the opposite horizontal direction from the horizontal-direction movement of the capillary in the second step so that the flat portion on the lower end of the capillary is positioned to face the first bump; a fifth step that lowers the capillary so that the wire is bent and pressed against the surface of the first bump, thus forming a second bump with the direction of inclination of the inclined wedge oriented toward the opposite side from the first conductor; and a sixth step that cuts and separates the wire from the second bump, thus forming a two-stage bump; and then the primary bonding is thereafter performed, after which the wire is looped from the first conductor with respect to the bump, and the secondary bonding is performed on the inclined wedge on the upper portion of the bump.

The above object is accomplished by still another set of unique sequential steps of the present invention for a bump formation method that includes: a first step that forms a ball on the tip end of a wire that passes through a capillary and joins the ball to a conductor to form a press-bonded ball; a second step that raises and moves the capillary in the horizontal direction so that a flat portion on the lower end of the capillary is positioned to face the press-bonded ball; a third step that lowers the capillary so that the press-bonded ball is pressed to form a first bump; a fourth step that raises and lowers the capillary in the opposite horizontal direction from the horizontal-direction movement of the capillary in the second step so that the flat portion on the lower end of the capillary is positioned to face the first bump; a fifth step that lowers the capillary so that the wire is bent and pressed against the surface of the first bump, thus forming a second bump; and a sixth step that raises and moves the capillary in the opposite horizontal direction from the horizontal-direction movement in the fourth step so as to cause the flat portion on the lower end of the capillary to be positioned to face the second bump; a seventh step that lowers the capillary so that the wire is bent and pressed against the surface of the second bump to form a third bump; and an eighth step that forms an inclined wedge on the final uppermost bump so that the direction of inclination of the inclined wedge is oriented toward the opposite side from the first conductor, the eighth step further cutting and separating the wire from the final uppermost bump; and then the primary bonding is thereafter performed, after which the wire is looped from the first conductor with respect to the bump, and the secondary bonding is performed on the inclined wedge on the upper portion of the bump.

BRIEF DESCRIPTION OF THE DRAWINGS

FIG. 5 shows in cross section the order of the sequential steps (a) through (e) of a conventional bump formation method; and FIG. 6 shows in cross section the order of the sequential steps (a) through (i) of another conventional bump formation method.

DETAILED DESCRIPTION OF THE INVENTION

A first embodiment of the present invention will be described with reference to FIG. 1.

Figure 1:
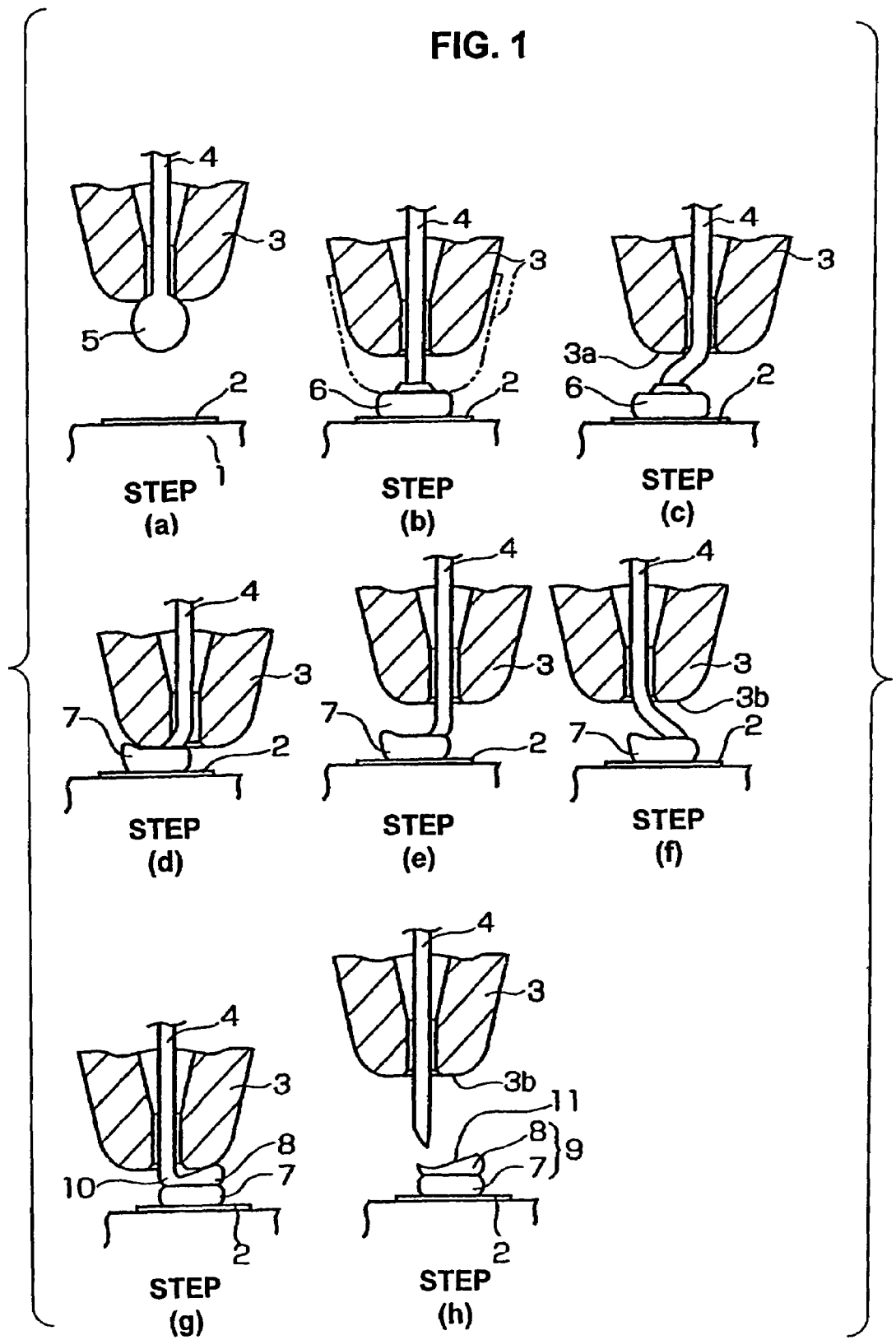
FIG. 1 shows in cross section the order of the sequential steps (a) through (f) according to a first embodiment of the bump formation method of the present invention.

In FIG. 1, the reference numeral 1 indicates a semiconductor element, and 2 indicates an electrode pad 2 which is formed on the surface of the semiconductor element 1.

As seen from step (a) in FIG. 1, a ball 5 is formed by a spark discharge, etc. on the tip end of a wire 4 that passes through a capillary 3, in a state in which a damper (not shown) is closed.

Next, in step (b), the damper (not shown) is opened, the capillary 3 is lowered as indicated by the two-dot chain line, and the ball 5 is joined to the surface of the electrode pad 2 by ultrasonic vibration, so that a press-bonded ball 6 is formed (or the ball 5 becomes the press-bonded ball 6).

Next, the capillary 3 is raised as indicated by the solid line in sep (b); and then in step (c), the capillary 3 is moved in the horizontal direction (to the right) so that a flat portion 3a on the lower end of the capillary 3 is positioned to face the press-bonded ball 6.

Next, in step (d), the capillary 3 is lowered, and the press-bonded ball 6 is pressed so that a first bump 7 is formed.

In the next step (e), the capillary 3 is raised. Then, in step (f), the capillary 3 is moved in the opposite horizontal direction from the above-described horizontal direction (i.e., toward the left), so that the flat portion 3b on the lower end of the capillary 3 is positioned so as to face the first bump 7.

Then in step (g), the capillary 3 is lowered, the wire 4 is bent and pressed while being completely superimposed on the first bump 7, and ultrasonic waves are applied so that the cut-out 10 is formed. As a result, a second bump 8 which has an inclined wedge 11 formed by the transfer of the external shape of the lower end surface 3b of the capillary 3 is formed on top of the first bump 7.

Next, in step (f) a damper (not shown) and the capillary 3 are both raised, and the damper is closed during this raising movement, so that the wire 4 is cut and separated from the root of the second bump 8. As a result, a two-stage bump 9 is formed.

Figure 2:
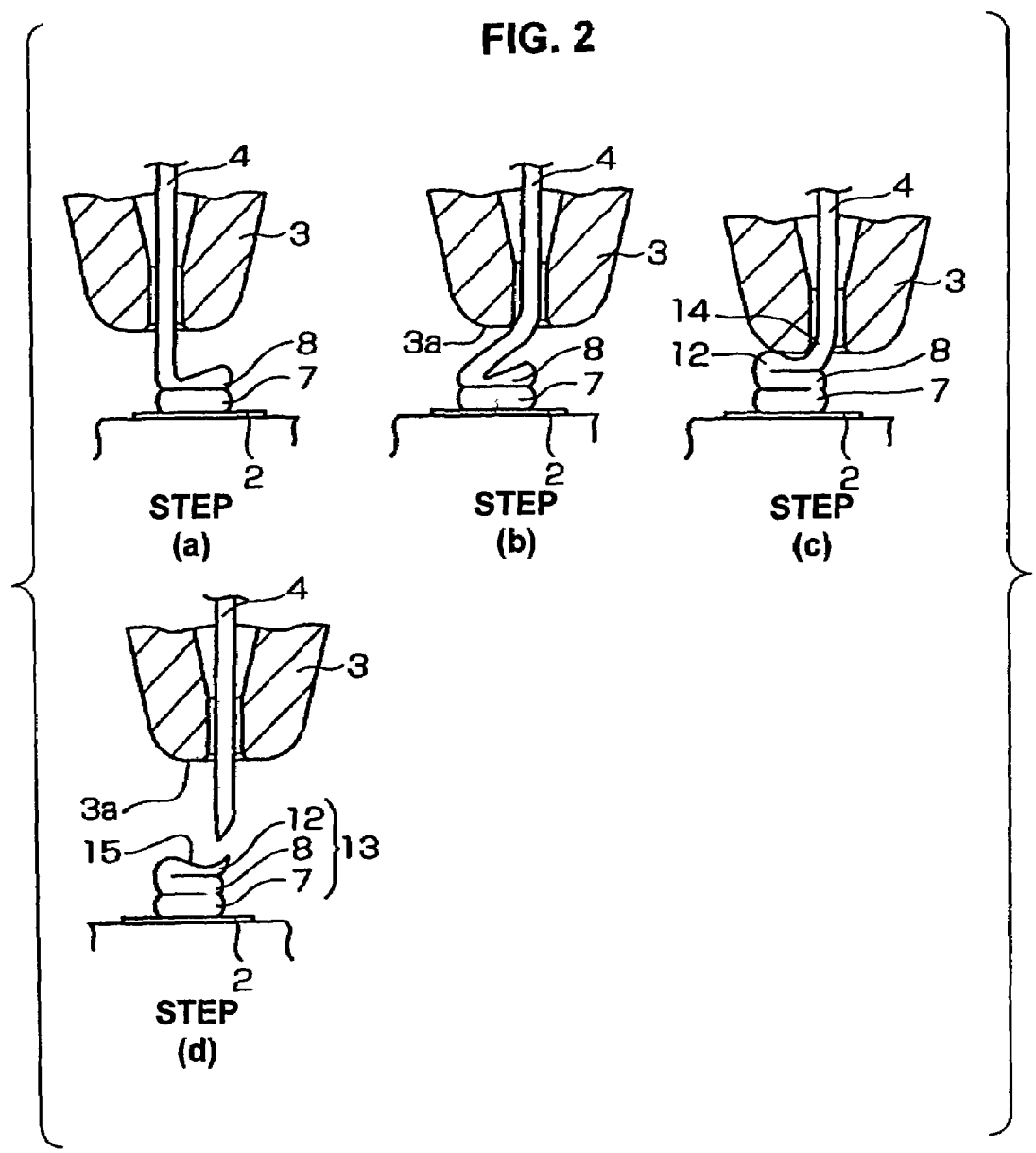
FIG. 2 shows in cross section the order of the sequential steps (a) through (d) according to a second embodiment of the bump formation method of the present invention, the step (a) in FIG. 2 being the step following the step (g) in FIG. 1.

FIG. 2 shows a second embodiment of the present invention.

This embodiment shows a case in which a three-stage bump 13 is formed (as shown in the illustration for the step (d) in FIG. 2) by forming a third bump 12 which has an inclined wedge 15 formed by the transfer of the external shape of the lower end surface 3a of the capillary 3 on top of the second bump 8 formed in the steps shown in FIG. 1. The step (a) in FIG. 2 is the one that follows the step (g) in FIG. 1.

Following the step (g) in FIG. 1, the capillary 3 is raised in step (a) of FIG. 2 with the damper (not shown) kept opened.

In step (b) of FIG. 2, the capillary 3 is moved in the horizontal direction (to the right) so that the flat portion 3*a* of the capillary 3 is positioned to face the second bump 8.

Then, in step (c), the capillary 3 is lowered, the wire 4 is bent and pressed while being completely superimposed on the surface of the second bump 8, and ultrasonic waves are applied so that a cut-out 14 is formed. As a result, a third bump 12 which has an inclined wedge (15) formed by the transfer of the external shape of the lower end surface 3*a* of the capillary 3 is formed on top of the second bump 8.

Next, in step (d), the damper (not shown) and the capillary 3 are both raised, and the camper is closed during this raising movement, so that the wire 4 is cut and separated from the root of the third bump 12. As a result, a three-stage bump 13 is formed.

Thus, in cases where a two-stage bump 9 is formed as shown in FIG. 1, or in cases where a three-stage bump 13 is formed as shown in FIG. 2, the formation of a ball 5 needs to be performed only in the single step as shown in step (a) in FIG. 1, and the cutting of the wire needs be performed only in the single step as shown in step (h) of FIG. 1(*h*) or in step (d) of FIG. 2. Thus, the productivity increases Furthermore, in cases where the two-stage bump 9 shown in FIG. 1 is formed, the second bump 8 is formed by pressing the wire 4 with the wire completely superimposed on the first bump 7, and in cases where the three-stage bump 13 shown in FIG. 2 is formed, the third bump 12 is formed by pressing the wire 4 with the wire completely superimposed on the second bump 8. Accordingly, the two-stage bump 9 and three-stage bump 13 can be formed with a uniform height and shape.

In the above-described embodiments, a two-stage bump 9 and a three-stage bump 13 are formed. However, it is course possible to form a bump of four or more stages.

Figure 3:
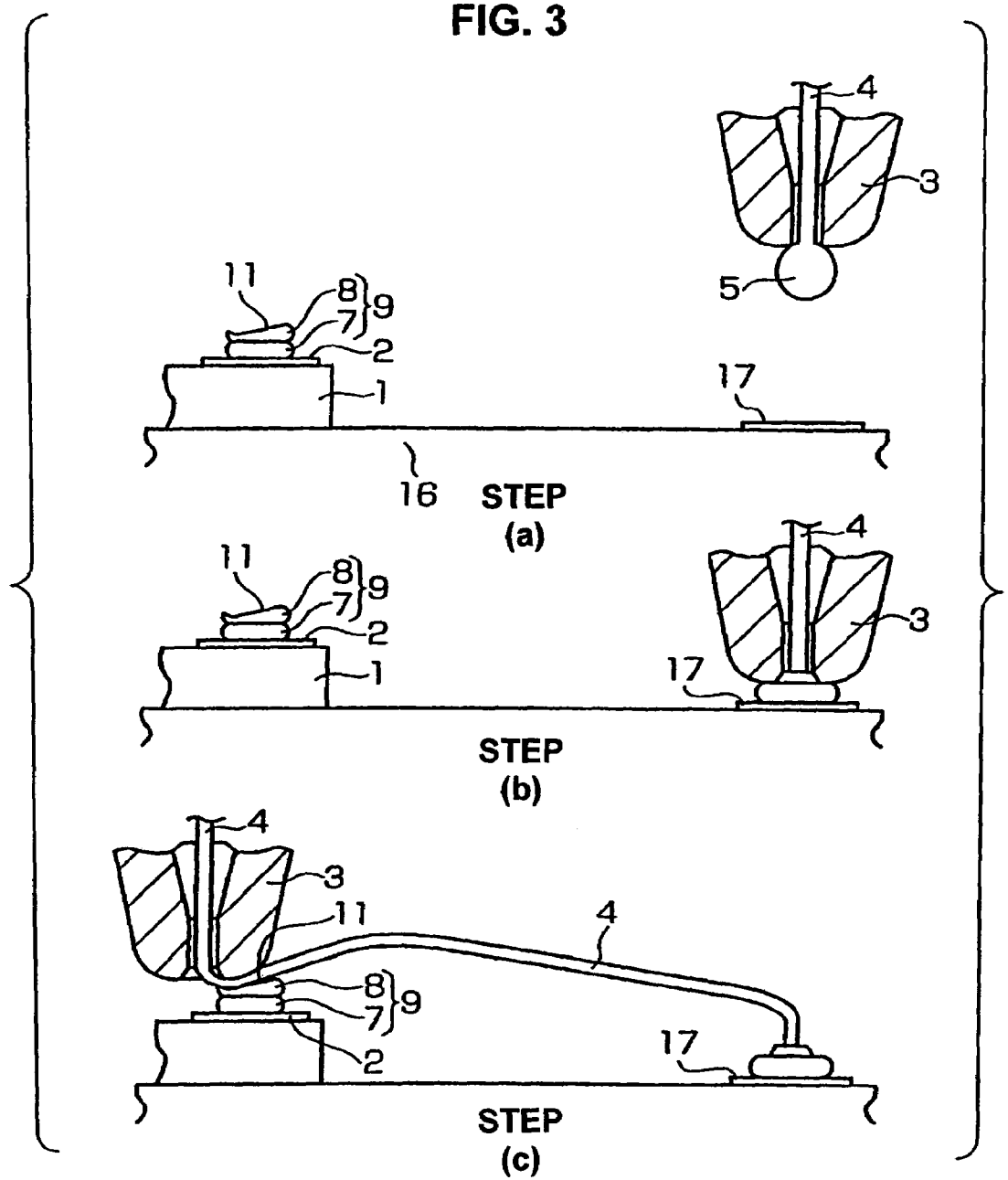
FIG. 3 shows diagrams that illustrate one example of the conditions of wire bonding between a die and wiring done by the wire bonding method of one embodiment of the present invention.

FIG. 3 shows one example of a process in which wire bonding is performed between a semiconductor element and wiring using the wire bonding method of the present invention shown in FIG. 1.

In FIG. 3, the reference numeral 16 indicates a circuit board consisting of a substrate such as a ceramic substrate or printed substrate, etc. or consisting of a lead frame, etc. A semiconductor element 1 that has an electrode pad 2 thereon is mounted on this circuit board 16, and wiring 17 is formed on the circuit board 16.

When wire bonding is performed, the two-stage bump 9 shown in the illustration of step (h) of FIG. 1 is formed so that the direction of the inclined wedge 11 of this two-stage bump 9 is toward the opposite side from the wiring 17 as shown in the illustration of step (a) in FIG. 3.

In step (a) in FIG. 3, a ball 5 is formed by means of a spark discharge, etc. on the tip end of the wire 4.

Then, in step (b), the capillary 3 is positioned on the wiring 17, and primary bonding is performed.

Next, in step (c), the wire 4 is looped, the wire 4 is positioned on the upper portion of the inclined wedge 11 of the two-stage bump 9, the wire 4 is secondarily bonded to the inclined wedge 11, and the wire 4 is cut.

Thus, since the wire 4 is joined along the inclined wedge 11, contact between the wire 4 and the semiconductor element 1 is prevented. Furthermore, the joining area of the inclined wedge 11 is increased, so that the joining strength increases.

Figure 4:
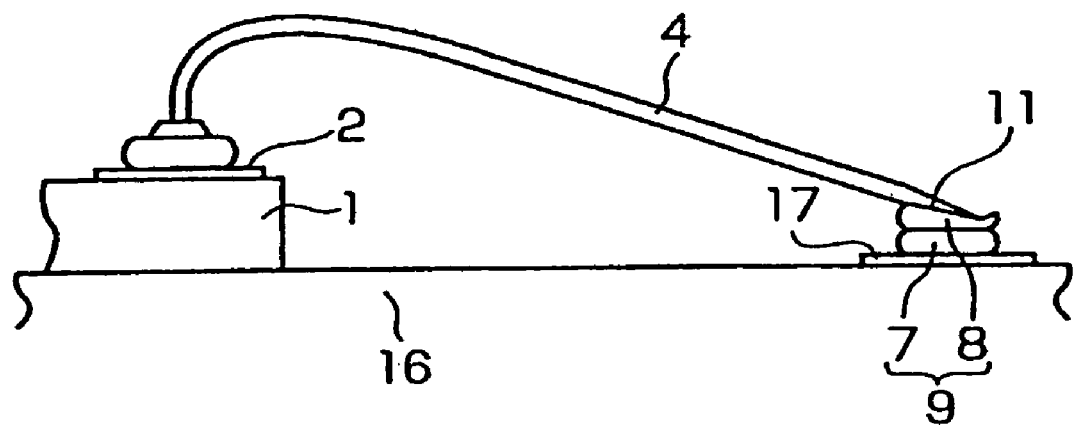
FIG. 4 shows diagrams that illustrate another example of the conditions of wire bonding between a die and wiring done by the wire bonding method of one embodiment of the present invention.

FIG. 4 shows another example of the conditions of wire bonding between a semiconductor element and wiring obtained by the wire bonding method of the present invention.

In the above-described embodiment of FIG. 3, a two-stage bump 9 is formed on the electrode pad 2, primary bonding is performed on the surface of the wiring 17, and secondary bonding is performed on the inclined wedge 11 of the two-stage bump 9. In the case shown in FIG. 4, a two-stage bump 9 is formed on the wiring 17 by the steps (a) through 1 (h) shown in FIG. 1, and the inclined wedge 11 on this two-stage bump 9 is formed so as to face the opposite side from the semiconductor element 1. The primary bonding is performed on the electrode pad 2, the secondary bonding is performed on the inclined wedge 11 of the two-stage bump 9, and the wire 4 is cut by the steps (a) through (c) shown in FIG. 3.

Thus, in the case of FIG. 3, the wiring 17 constitutes the first conductor, and the electrode pad 2 constitutes the second conductor. On the other hand, in the case of FIG. 4, the electrode pad 2 constitutes the first conductor, and the wiring 17 constitutes the second conductor.

In the case of the three-stage bump 13 shown in FIG. 2 as well, it goes without saying that wire bonding is likewise performed between the semiconductor element 1 and wiring 17. In this case as well, the inclined wedge 15 is formed so that the direction of inclination of this inclined wedge 15 is toward the opposite side from the first conductor.

As seen from the above, in the bump formation method of the present invention, the method includes a first step that forms a ball on the tip end of a wire that passes through a capillary and joins the ball to a conductor to form a press-bonded ball, a second step that raises and moves the capillary in the horizontal direction so that a flat portion on the lower end of the capillary is positioned to face the press-bonded ball, a third step that lowers the capillary so that the press-bonded ball is pressed to form a first bump, a fourth step that raises and lowers the capillary in the opposite horizontal direction from the horizontal-direction movement of the capillary in the second step so that the flat portion on the lower end of the capillary is positioned to face the first bump, a fifth step that lowers the capillary so that the wire is bent and pressed against the surface of the first bump, thus forming a second bump, and a sixth step that cuts and separates the wire from the second bump. Accordingly, bumps are formed with a uniform height and shape, and the method is superior in terms of productivity.

The invention claimed is:

1. A bump formation method comprising a sequence of:
    a first step that forms a ball on a tip end of a wire that passes through a capillary and joins said ball to a conductor to form a press-bonded ball;
    a second step that raises and then moves said capillary in a horizontal direction to a first position so that a flat portion on a lower end of said capillary on a side of said capillary opposite to said horizontal-direction movement is positioned to face said press-bonded ball;
    a third step that lowers said capillary so that said press-bonded ball is pressed by said flat portion of said capillary to form a first bump;
    a fourth step that raises and moves said capillary in an opposite horizontal direction from said horizontal-direction movement of said capillary in said second step to a second position so that a flat portion on said lower end of said capillary on a side of said capillary opposite to said opposite horizontal-direction movement is positioned to face said first bump;

a fifth step that lowers said capillary so that said wire is bent and pressed against a surface of said first bump by said flat portion of said capillary, thus forming a second bump; and a sixth step that cuts said wire from said second bump.

2. A bump formation method comprising a sequence of:

a first step that forms a ball on a tip end of a wire that passes through a capillary and joins said ball to a conductor to form a press-bonded ball;

a second step that raises and moves said capillary in a horizontal direction so that a flat portion on a lower end of said capillary is positioned to face said press-bonded ball;

a third step that lowers said capillary so that said press-bonded ball is pressed to form a first bump;

a fourth step that raises and lowers said capillary in an opposite horizontal direction from said horizontal-direction movement of said capillary in said second step so that said flat portion on said lower end of said capillary is positioned to face said first bump;

a fifth step that lowers said capillary so that said wire is bent and pressed against a surface of said first bump, thus forming a second bump; and a sixth step that raises and moves said capillary in an opposite horizontal direction from said horizontal-direction movement in said fourth step so as to cause said flat portion on said lower end of said capillary to be positioned to face said second bump;

a seventh step that lowers said capillary so that said wire is bent and pressed against a surface of said second bump to form a third bump; and an eighth step that cuts said wire from a uppermost bump.

3. A wire bonding method in which wire bonding between a first conductor aid second conductor is executed by performing primary bonding to a surface of a first conductor and then performing secondary bonding to a surface of a second conductor, said method comprising a sequence of:

a first step that forms a ball on a tip end of a wire that passes through a capillary and joins said ball to a conductor to form a press-bonded ball;

a second step that raises and then moves said capillary in a horizontal direction to a first position so that a flat portion on a lower end of said capillary on a side of said capillary opposite to said horizontal-direction movement is positioned to face said press-bonded ball;

a third step that lowers said capillary so that said press-bonded ball is pressed by said flat portion of said capillary to form a first bump;

a fourth step that raises and moves said capillary in an opposite horizontal direction from said horizontal-direction movement of said capillary in said second step to a second position so that said flat portion on said lower end of said capillary on a side of said capillary opposite to said opposite horizontal-direction movement is positioned to face said first bump;

a fifth step that lowers said capillary so that said wire is bent and pressed against a surface of said first bump by said flat portion of said capillary, thus forming a second bump with a direction of inclination of an inclined wedge oriented toward an opposite side from said first conductor; and a sixth step that cuts said wire from said second bump, thus forming a two-stage bump; and then said primary bonding is thereafter performed, after which said wire is looped from the said first conductor with respect to said bump, and said secondary bonding is performed on said inclined wedge on the upper portion of said bump.

4. A wire bonding method in which wire bonding between a first conductor and second conductor is executed by performing primary bonding to a surface of a first conductor and then performing secondary bonding to a surface of a second conductor, said method comprising a sequence of:

a first step that forms a ball on a tip end of a wire that passes through a capillary and joins said ball to a conductor to form a press-bonded ball;

a second step that raises and moves said capillary in a horizontal direction so that a flat portion on a lower end of said capillary is positioned to face said press-bonded ball;

a third step that lowers said capillary so that said press-bonded ball is pressed to form a first bump;

a fourth step that raises and lowers said capillary in an opposite horizontal direction from said horizontal-direction movement of said capillary in said second step so that said flat portion on said lower end of said capillary is positioned to face said first bump;

a fifth step that lowers said capillary so that said wire is bent and pressed against a surface of said first bump, thus forming a second bump; and a sixth step that raises and moves said capillary in an opposite horizontal direction from said horizontal-direction movement of said capillary in said fourth step so as to cause said flat portion on said lower end of said capillary to be positioned to face said second bump;

a seventh step that lowers said capillary so that said wire is bent and pressed against a surface of said second bump to form a third bump; and an eighth step that forms an inclined wedge on a final uppermost bump so that a direction of inclination of said inclined wedge is oriented toward an opposite side from said first conductor, said eighth step further cutting said wire from said final uppermost bump, thus forming a multi-stage bump; and then said primary bonding is thereafter performed, after which said wire is looped from said first conductor with respect to said bump, and said secondary bonding is performed on said inclined wedge on the upper portion of said bump.

* * * * *